United States Patent
Tigwell et al.

(10) Patent No.: US 8,525,023 B2
(45) Date of Patent: Sep. 3, 2013

(54) COOLED CURRENT LEADS FOR COOLED EQUIPMENT

(75) Inventors: Neil Charles Tigwell, Witney (GB); Stephen Paul Trowell, Louth (GB)

(73) Assignee: Siemens plc, Frimley, Camberley, Surrey (GB)

( * ) Notice: Subject to any disclaimer, the term of this patent is extended or adjusted under 35 U.S.C. 154(b) by 938 days.

(21) Appl. No.: 12/540,842

(22) Filed: Aug. 13, 2009

(65) Prior Publication Data

US 2010/0051307 A1 Mar. 4, 2010

(30) Foreign Application Priority Data

Aug. 14, 2008 (GB) .................................. 0814797.7

(51) Int. Cl.
  *H02G 15/24* (2006.01)
(52) U.S. Cl.
  USPC ......... 174/15.5; 174/15.4; 174/15.6; 62/51.1; 62/48.3
(58) Field of Classification Search
  USPC ....................................................... 174/15.5
  See application file for complete search history.

(56) References Cited

U.S. PATENT DOCUMENTS

| 4,043,031 | A  | * | 8/1977 | Friedrich et al. | 29/870 |
| 5,120,705 | A  | * | 6/1992 | Davidson et al. | 505/220 |
| 6,034,324 | A  | * | 3/2000 | Dixon et al. | 174/15.4 |
| 6,888,060 | B2 | * | 5/2005 | Ashibe et al. | 174/15.3 |
| 7,729,731 | B2 | * | 6/2010 | Ashibe et al. | 505/220 |
| 7,928,321 | B2 | * | 4/2011 | Corsaro et al. | 174/125.1 |
| 2005/0204751 | A1 | * | 9/2005 | White et al. | 62/51.1 |
| 2006/0207266 | A1 | * | 9/2006 | Belton et al. | 62/51.1 |

FOREIGN PATENT DOCUMENTS

GB 2 435 318 A 8/2007

OTHER PUBLICATIONS

Daugherty, Mark A. et al., "HTS Current Lead Using a Composite Heat Pipe", IEEE Transactions on Applied Superconductivity, vol. 5, No. 2, pp. 773-776, Jun. 1995.
Daugherty, M.A. et al., "Assembly and Testing of a Composite Heat Pipe Thermal Intercept for HTS Current Leads", Advances in Cryogenic Engineering, vol. 41, pp. 579-585, 1995.
Blumenfeld, Philip E. et al., "High Temperature Superconducting Current Lead Test Facility with Heat Pipe Intercepts", IEEE Transactions on Applied Superconductivity, vol. 9, No. 2, pp. 527-530, Jun. 1999.
Daugherty, M.A. et al., "HTS High Gradient Magnetic Separation System", IEEE Transactions on Applied Superconductivity, vol. 7, No. 2, pp. 650-653, Jun. 1997.
UK Search Report dated Oct. 23, 2008 (five (5) pages).

* cited by examiner

*Primary Examiner* — William H. Mayo, III
*Assistant Examiner* — Hiram E Gonzalez
(74) *Attorney, Agent, or Firm* — Crowell & Moring LLP

(57) ABSTRACT

A cooled current lead for conducting electrical current into a cooled vessel. The current lead comprises an electrical conductor (22) comprising a region (29) which, in use, is heated by electrical current flowing through it; a cooled component (31) situated above a the region (29) and which is provided with a path for removal of heat; and a thermo-siphon comprising a cavity (35) in thermal contact with both the region of the electrical conductor and the cooled component, said cavity containing a fluid (35).

11 Claims, 6 Drawing Sheets

COOLED CURRENT LEADS FOR COOLED EQUIPMENT

The present invention relates to current leads used to introduce and withdraw electric current to and from a cryostat containing electrical equipment. The invention particularly relates to such current leads as used to introduce and withdraw electric current to and from a cryogenically cooled superconducting magnet used for nuclear magnetic resonance (NMR) or magnetic resonance imaging (MRI). The present invention may, however, be applied to current leads for introducing and withdrawing electric current from any cooled electrical equipment.

FIG. 1 schematically illustrates a typical arrangement of a cryostat containing a cooled cylindrical magnet 10 forming part of a nuclear magnetic resonance (NMR) or magnetic resonance imaging (MRI) imaging system. Cooled superconducting magnet 10 is provided within cryogen vessel 12, itself retained within an outer vacuum chamber (OVC) 14. The magnet is partially immersed in a liquid cryogen 15, for example liquid helium at a temperature of about 4.2K. One or more thermal radiation shields 16 are typically provided in the vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Alternatively, a refrigerator 17 may be located within access turret 19, which retains access neck (vent tube) 20 mounted at the top of the cryostat. The refrigerator 17 typically has two or more refrigeration stages. The first stage, in a helium-cooled system, is typically thermally linked, as shown, to thermal radiation shield 16, and cools the shield to a temperature in the range 50-100K. The second stage typically cools cryogen gas within the cryogen vessel 12 to a temperature in the region 4-10K, in some arrangements by recondensing it into liquid 15.

Flexible electrical connections 21, 21a are shown. Negative electrical connection 21a may be connected to the interior of the cryogen vessel, as shown, providing a negative electrical connection to the magnet 10 through the body of the cryostat. Positive electrical connection 21 is usually provided by a conductor passing through the vent tube 20, and must be isolated from the body of the cryostat, which serves as a negative earth. The connections may be reversed, with a positive earth through the body of the cryostat, and a negative connection passing through the vent tube. The former arrangement will be assumed in the following description.

For fixed current lead (FCL) designs, a separate vent path, known as an auxiliary vent and not shown in FIG. 1, is provided as a fail-safe vent in case of blockage of the vent tube 20.

FIG. 2 shows a conventional positive current lead 22 as mounted within a vent tube 20 within turret 19. The vent tube 20 is typically used as a negative current lead, being electrically part of the cryogen vessel. Positive current lead 22 is connected to positive current connection 21, for example by soldering or brazing. Typically, the positive current lead 22 is of stainless steel, the positive current connection 21 is of insulated copper, and they are electrically joined by brazing 23. Stainless steel is found to have useful properties for the positive current lead 22. It has low thermal conductivity, and an acceptably high electrical connectivity. A heat station 24 is shown, thermally linked both to positive current lead 22 and to the thermal radiation shield 16 (not shown in FIG. 2). Heat station 24 is cooled by the first stage of the refrigerator 17, by thermal conduction through the thermal radiation shield 16. The heat station 24 is typically a solid copper block, having a first hole through which positive current lead 22 passes, in thermal contact, and a second hole 28 through which escaping cryogen gas may pass. The normal escape path for cryogen gas is shown as broken line 27, leading out through port 25. Electrical isolation must be provided between the positive current lead 22 and the negative current lead (vent tube) 20, despite the presence of the heat station 24. In an attempt to maximise the cross-section of the gas flow path through hole 28 without overly compromising thermal conduction through the heat station 24, the hole 28 is typically kidney-shaped. Interference of the heat station 24 with the flow of gas through the vent tube 20 reduces the effectiveness of gas cooling in locations such as 29, where little gas flows.

An electrical contact 31 is provided at the upper end of the positive current lead 22 and serves to electrically contact the positive current lead 22 to an external power supply (not illustrated). The contact 31 is typically a copper block soldered to a copper braid or laminate conductor which in turn is connected to an insulated lead-through which traverses the turret 19 or turret cover 26 and enables external connection to a power supply.

The interior of the positive current lead 22 provides part of an auxiliary vent path 23a. The auxiliary vent path continues through auxiliary vent tube 30 and auxiliary vent fitting 32 and is usually closed by a burst disc 34 or equivalent. In the case of magnet quench, a large volume of gaseous cryogen needs to be quickly vented from the cryogen vessel. This is normally achieved by a quench valve connected to the vent tube 20. However, it is possible that the quench valve and/or the vent tube will become blocked by air or water ice, or other contaminants. In order to ensure a safe escape passage for the cryogen gas, the auxiliary vent path provides an independent egress route for the gas, and opens by bursting of the burst disc 34 at a pressure which is safe, but in excess of the pressure at which the quench valve opens. Burst disc 34 may be replaced by an equivalent valve.

In use, during ramping of current into, or from, the magnet, cryogen gas 30 boiled off from liquid cryogen 15 escapes the cryogen vessel through vent tube 30 to atmosphere, or to a recuperation facility. As the gas escapes, it cools the positive and negative current leads 22, 20 as it escapes.

In an example design, fixed current leads 20, 22 carry currents of up to 700 A to the magnet during current ramping. The leads 20, 22 extend from room temperature at the cover 26 of turret 19 interface into the cryogen vessel containing cryogen at a temperature of about 4K, for a helium-cooled arrangement. The materials and designs chosen for the current leads are therefore compromised between competing requirements for high electrical conductivity and minimal heat conduction along their length.

An example of conventional fixed current leads 20, 22 are provided by thin-walled (0.9 mm) stainless steel tubes, with gas cooling during ramping due to the passage of boiled-off cryogen gas between the tubes, as shown in FIG. 2. However, the heat transfer between the cold escaping gas and the stainless tubes is found to be poor. This, combined with the relatively high electrical resistivity of the thin walled tubes, results in excessively high temperatures in parts of the tubes, leading to potential damage to wiring and other components. In an example arrangement, a temperature of 675K was recorded at a position approximately corresponding to location 29 in FIG. 2 on a thin-walled stainless steel positive current lead carrying a current of 700 A. This location 29 is believed to be poorly cooled as it faces away from the gas flow through hole 28, and flow past the location is typically impeded by an electrical conductor attached to contact 31.

Other electrical conductors also pass by this location, contributing to poor cooling and possibly being damaged by the high temperatures.

The negative current lead 20 has been found relatively immune to over-heating. This is believed to be due to at least the following reasons. The negative current lead 20 has a greater diameter, and so a greater material cross-sectional area, than the positive current lead, causing reduced resistance. In addition, the multiple current paths available through the cryostat mean that the negative current lead does not carry all of the applied current.

A number of solutions have been considered to increase the cooling of the positive current lead 22, but revealed other difficulties. For example, an increase in the cross-sectional area of the material of the positive current lead 22 caused increased static heat load. Adding cooling fins to the positive current lead 22 which protrude into the gas flow path was found to impede gas egress flow during a quench. An arrangement in which escaping gas is normally allowed to vent through the inside of the positive current lead degrades the integrity of the auxiliary vent path, which is no longer independent of the primary vent path.

The present invention seeks to address at least some of the disadvantages of the known arrangements, and provides an improved cooling arrangement for current leads for cooled equipment.

Accordingly, the present invention provides apparatus as defined in the appended claims.

The above, and further, objects, advantages and characteristics of the present invention will become more apparent by consideration of the following description of certain embodiments thereof, in conjunction with the accompanying drawings, wherein.

According to the present invention, cooling of the positive current lead is achieved by providing a heat pipe, also known as a thermo-siphon, to carry heat along the length of the current lead without increasing its steady-state thermal load into the cryostat.

Figure 1:
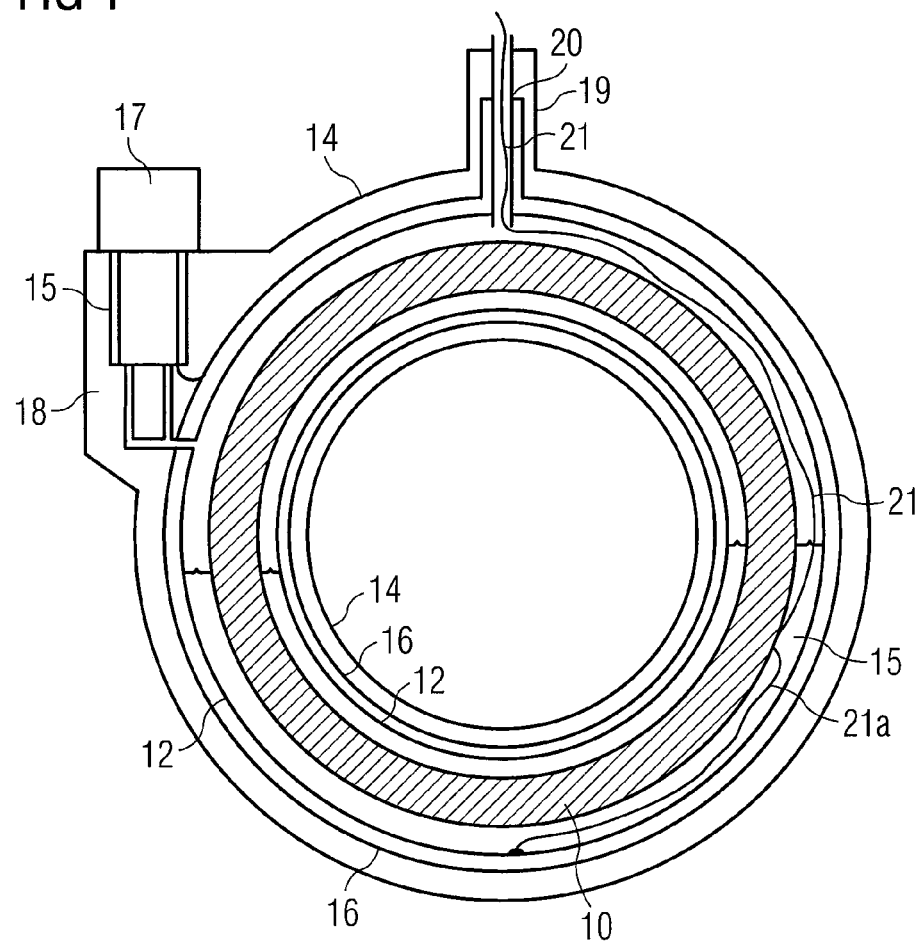
FIG. 1 shows a conventional arrangement of a cylindrical magnet within a cryostat.
Figure 2:
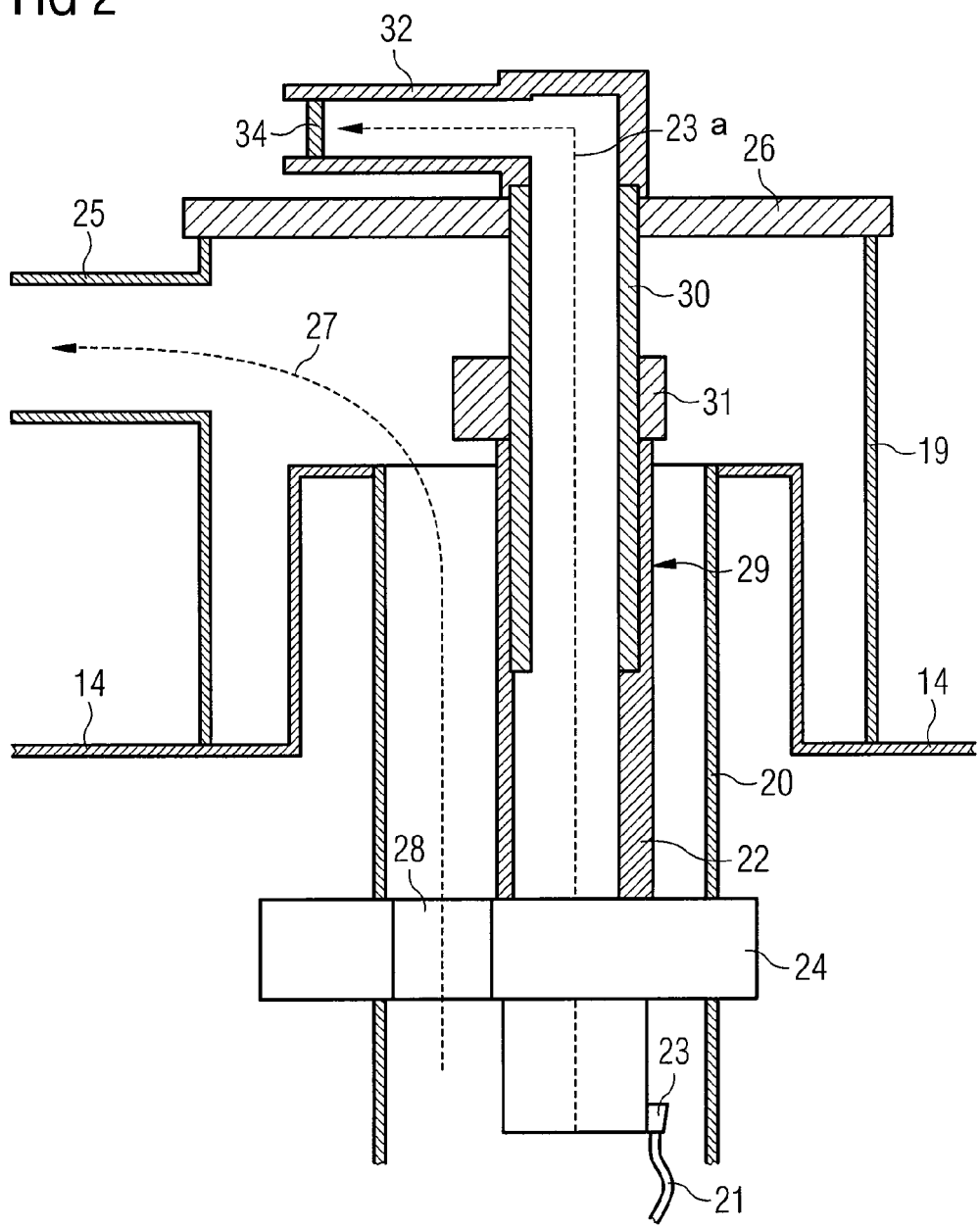
FIG. 2 shows a conventional arrangement of cooled current leads with the turret of a cryostat.
Figure 3:
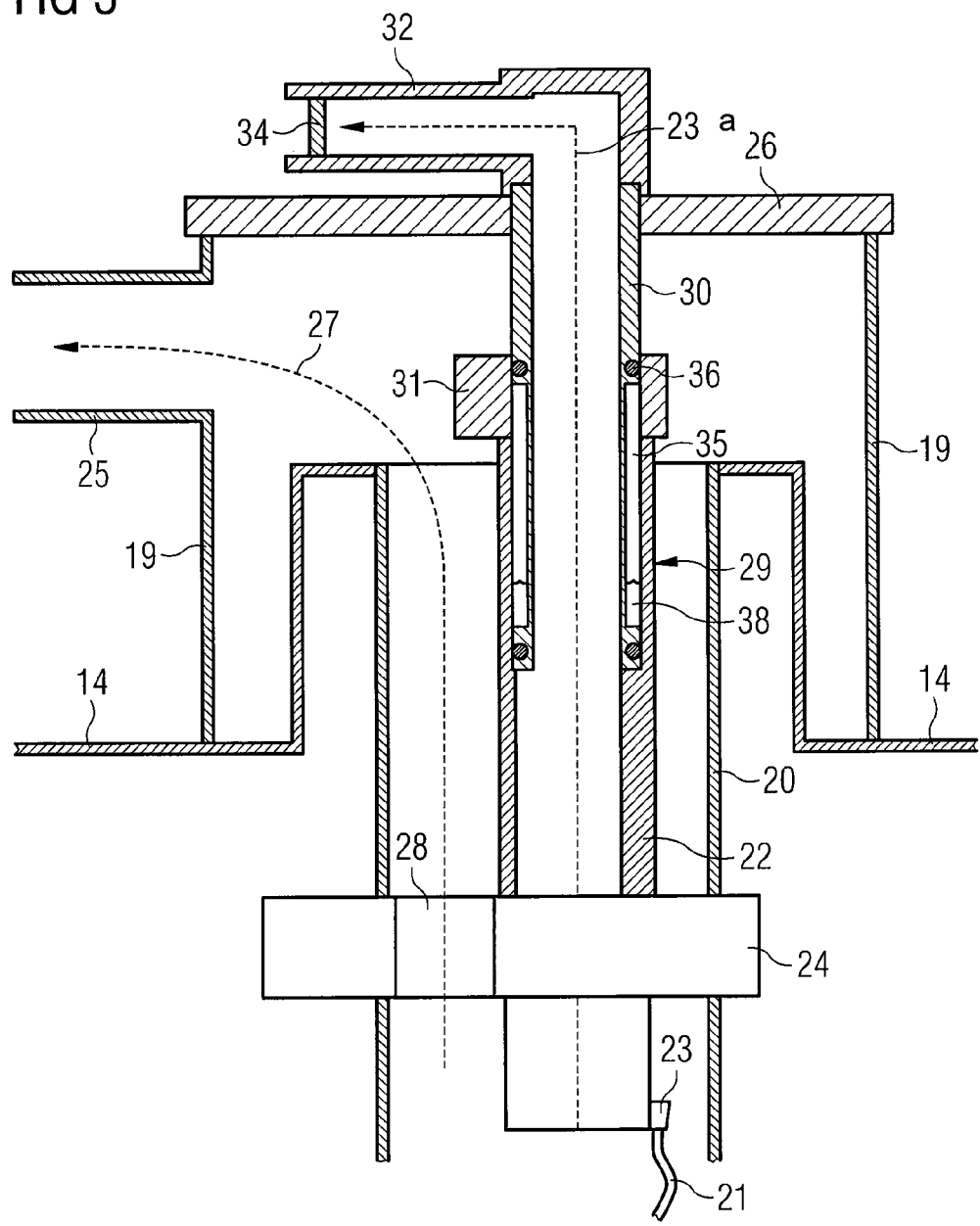
FIG. 3 shows an arrangement of cooled current leads according to a first embodiment of the present invention.

FIG. 3 illustrates a first embodiment of the present invention. Features corresponding to features of FIG. 2 carry corresponding reference numerals. As shown in FIG. 3, a thermo-siphon is provided by a cavity 35 between the upper part of the positive current lead 22 and a thermally non-conductive auxiliary vent tube 30. The cavity 35 is sealed by one or more o-rings 36. Alternatively, the auxiliary vent tube 30 may be adhesively bonded to the positive current lead 20 and the electrical connection 31, to seal the cavity 35.

A volume of water 38 is enclosed within the cavity 35 with air or other gas at atmospheric pressure and acts to transfer heat from the hot region 29 of the current lead 22 during ramping to the thermally conductive electrical connection 31 at the top of the positive current lead 22, which is cooled by escaping cryogen gas. Some additional cooling may be provided by thermal conduction along the electrical conductor (not shown) attached to connection 31.

As illustrated, the volume of water 38 is in contact with the hot positive current lead 22. As mentioned above, parts 29 of the current lead 22 have been known to reach temperatures of over 600K. In use, during current ramping, the heating of the current lead 22 will cause water 38 to boil. The resulting water vapour will fill the cavity 35, and some will come into contact with the electrical connection 31, which is thermally conductive and cooled by escaping cryogen gas. The ratio of water to air within the cavity 35 is chosen such that pressure build up is not excessive when the water boils. The increased pressure within the cavity 35 when the water boils serves to increase the boiling point of water, and increases the effectiveness of the thermosiphon at higher temperatures. Cooled water vapour will condense on the surface of the electrical connection, within the cavity 35, and will return to the base of the cavity as liquid. In this way, heat is removed from the positive current lead 22 and transferred to the electrical connection 31 which is cooled by escaping gas and thermal conduction. This process will continue for as long as the parts of the positive current lead 22 exposed to the cavity 35 are at a temperature in excess of the boiling point of water. Even after the positive current lead 22 has cooled to below the boiling point of water, convection currents in the cavity 35 will transfer heat from the positive current lead 22 to the electrical connection 31.

When boiling of the water has started, the pressure within cavity 35 will begin to rise. This will raise the energy required for further boiling, which in turn raises the effectiveness of the thermo-siphon cooling.

When current ramping stops, the flow of cryogen gas through the vent tube 20 will slow or cease, and a thermal equilibrium will be reached. Typically, the temperature of the water 38 in this thermal equilibrium state will be below its freezing point. The resulting water ice will not support any convection currents, and has a low thermal conductivity. The presence of water ice in the cavity 35 will not cause a significant thermal load on the cryogen vessel. The materials and thickness of the walls of the positive current lead 22 and the vent tube 30 must be chosen such that the expansion of water on freezing does not place an unacceptable strain on either of them. In alternative embodiments, the water 38 may be replaced by another liquid having a boiling point appropriate for the temperatures involved.

The thermo-siphon 35, 38 is only activated by the thermal energy of ramping which causes heating of the positive current lead. The thermo-siphon has a negligible contribution to the static heat load. In steady-state operation, when no ramping is taking place, the turret 19 at the base of the auxiliary vent tube 30 is at a temperature of approximately 273K. The water 38 may freeze, which is an advantage since additional latent heat is available for cooling of the turret, provided the water expansion on freezing is managed. Thermal conduction through ice would increase the heat load to the first stage by approximately 400 mW, negligible compared to the 50 W of cooling available. In general, other fluids could be used as the heat transfer medium, depending on the temperatures involved.

Figure 4:
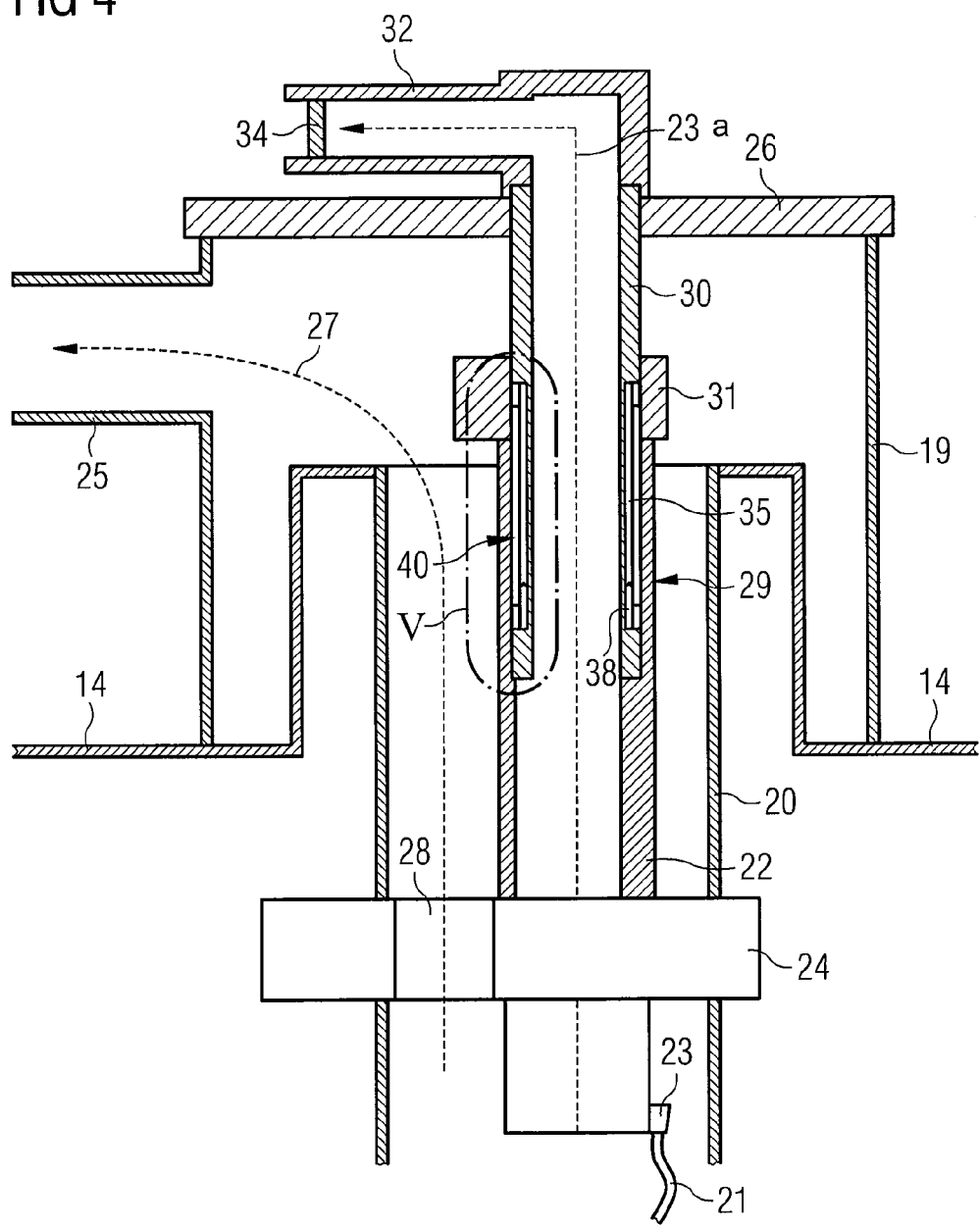
FIG. 4 shows an arrangement of cooled current leads according to a second embodiment of the present invention.
Figure 5:
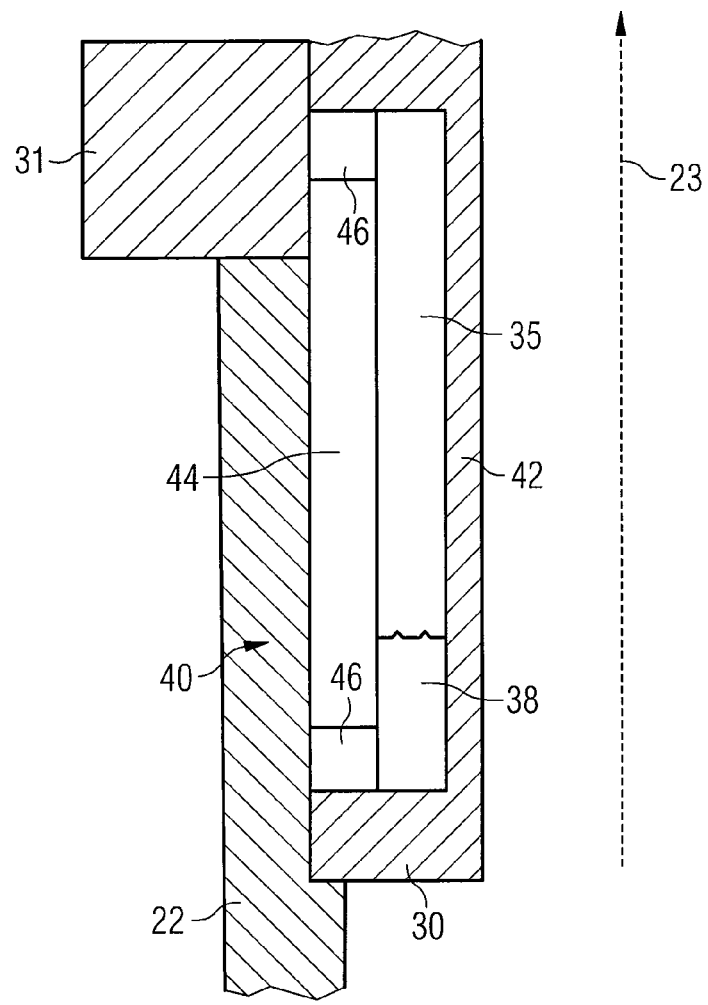
FIG. 5 shows an enlargement of part of the arrangement of FIG. 4.

FIG. 4 shows a second embodiment of the present invention. Features common with features of FIG. 3 carry corresponding reference numerals. The embodiment of FIG. 4 differs from that of FIG. 3 in that the auxiliary vent tube 30 has a double-walled portion 40, and that the cavity 35 is located between the walls of the double-walled portion. FIG. 5 shows an enlargement of that part of FIG. 4 labelled V. In the illustrated embodiment, the inner wall 42 of the double-walled portion 40 forms part of the auxiliary vent tube 30. The outer wall 44 preferably comprises a concentric tube of thermally insulating material having the same external diameter as the auxiliary vent tube 30. Thermally conducting rings 46, for example of copper, are placed at upper and lower ends of the outer wall 44. These also preferably have the same outer diameter as the auxiliary vent tube 30, which is also the same as the inner diameter of the adjacent portion of the positive current lead 22. The auxiliary vent tube 30, rings 46 and outer wall 44 form a sealed enclosure around the cavity 35. The inner wall 42 may be formed in two parts, or the auxiliary vent tube 30 may otherwise be formed of two parts, to facilitate assembly of the double-walled portion 40.

In this embodiment, the water 38 is not in direct contact with the positive current lead 22, but thermal conduction between the positive current lead 22 and the water 38 is ensured by lower thermally conductive ring 46. Similar thermal conduction between the cavity 35 and the electrical connection 31 is provided by the upper thermally conductive ring 46. In operation, the thermo-siphon current lead cooling arrangement of FIGS. 4-5 operates in much the same way as the thermo-siphon current lead cooling arrangement of FIG. 3.

As illustrated, the volume of water 38 is in thermal contact with the hot positive current lead 22 through lower thermally conductive ring 46. In use, during current ramping, the heating of the current lead 22 will cause water 38 to boil. The resulting water vapour will fill the cavity 35, and some will come into contact with the upper thermally conductive ring 46, which is in thermal contact with electrical connection 31, which is itself thermally conductive and cooled by escaping cryogen gas. The cooled water vapour will condense on the surface of the upper thermally conductive ring 46, within the cavity 35, and will return to the base of the cavity as liquid. In this way, heat is removed from the positive current lead 22 and transferred to the electrical connection 31 which is cooled. This process will continue for as long as the lower thermally conductive ring 46 is at a temperature in excess of the boiling point of water. Even after the positive current lead has cooled to below the boiling point of water, convection currents in the cavity 35 will transfer heat from the lower thermally conductive ring 46 to upper thermally conductive ring 46.

When current ramping stops, the flow of cryogen gas through the vent tube 20 will slow or cease, and a thermal equilibrium will be reached. Typically, the temperature of the water 38 in this thermal equilibrium state will be below its freezing point. The resulting water ice will not support any convection currents, and has a low thermal conductivity. The air within the cavity 35 may establish a convection current, but the effects of this are believed to be insignificant. The presence of water ice in the cavity 35 will not cause a significant thermal load on the cryogen vessel. The materials and thickness of the walls of the cavity 35 must be chosen such that the expansion of water on freezing does not place an unacceptable strain on either of them. In alternative embodiments, the water 38 may be replaced by another liquid having a boiling point appropriate for the temperatures involved.

In further embodiments, similar to the embodiment of FIGS. 4 and 5, the thermally conductive rings are not provided, but instead access is provided through holes or gaps in the outer wall for direct contact between the fluid 38 and the positive current lead 22 and the electrical connection 31.

In yet further embodiments, similar to the embodiment of FIGS. 4 and 5, the positive current lead 22 is a double-walled tube and the fluid-containing cavity 35 is provided between the walls of the positive current lead. As the positive current lead is typically made of metal, such embodiments may be found easier to manufacture than the double-skinned auxiliary vent tube of FIGS. 4 and 5.

Figure 6:
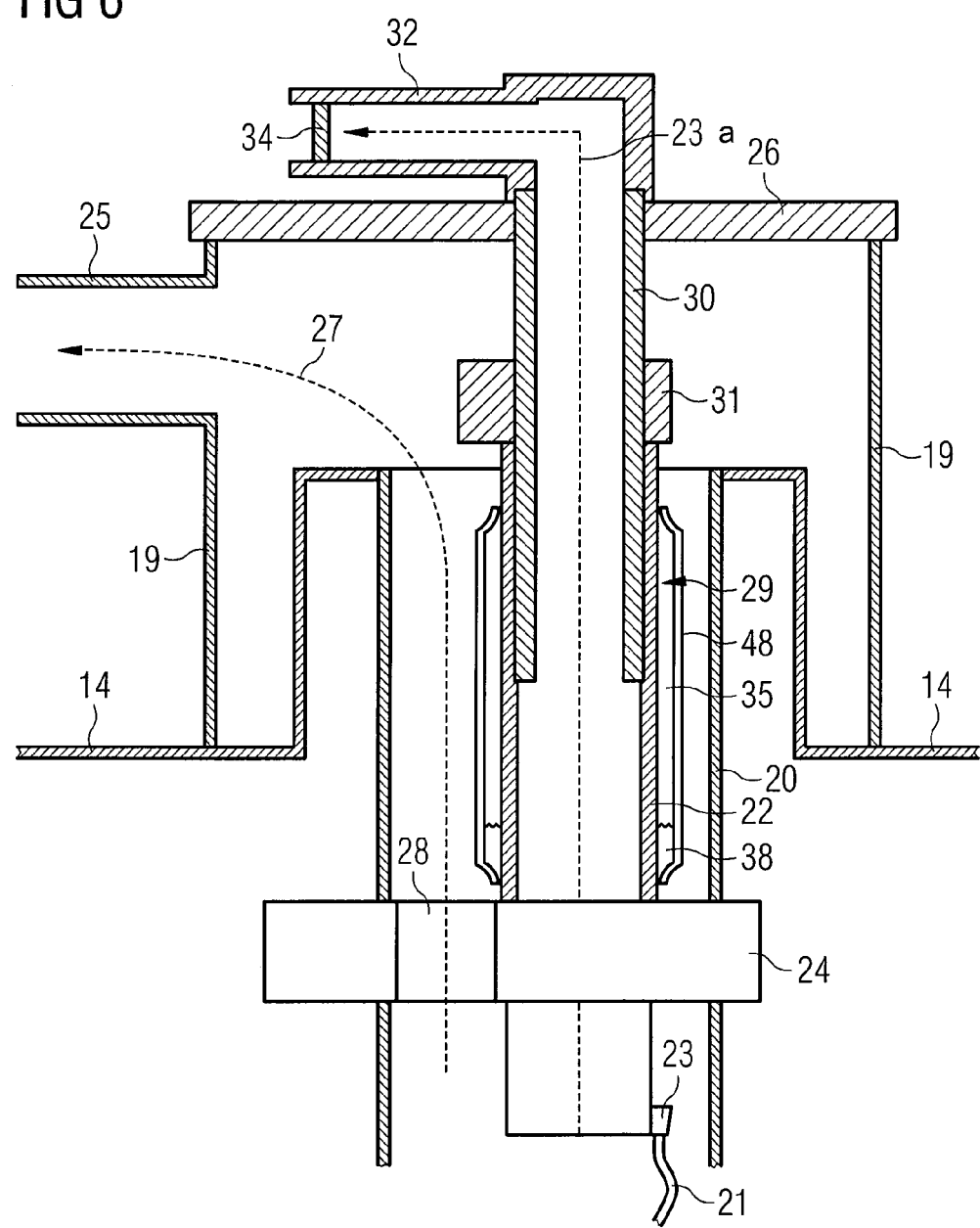
FIG. 6 shows an arrangement of cooled current leads according to another embodiment of the present invention.

FIG. 6 shows such an arrangement. As shown in FIG. 6, the thermo-siphon of this embodiment of the present invention may be provided by simply brazing, welding, soldering, gluing or otherwise sealing an outer wall 48 around the positive current lead 22, so that it is sealed at both ends to define a cylindrical cavity 35. An appropriate quantity of liquid 38 is introduced into the cavity with air at atmospheric pressure before it is sealed. In operation, boiling of the liquid 38 and convection currents established in the resulting vapour will serve to establish a more consistent temperature over the volume of the cavity 35 and the surface of its walls. This will prevent the formation of hot spots on the walls, such as at position 29, and the cooling provided by escaping gas will be distributed over the surface of the positive current lead enclosed within cavity 35, regardless of whether recondensation takes place at the cooler end. The outer wall 48 will need to be of a thermally conductive material to ensure that the contents of cavity 35 may be effectively cooled by heat transfer through fluid in the cavity and the outside wall 48 to escaping gas flowing over the outer surface of outer wall 48. However, such an arrangement will increase the thermal conductivity of the positive current lead 22 as a whole, which may increase the steady-state thermal load on the cryogen vessel through the positive current lead in normal operation, once ramping is complete.

A similar arrangement may be envisaged, wherein the wall 48 is placed within the electrical conductor 22, and is cooled by a flow of cooling fluid passing through the interior of the electrical conductor.

In the illustrated embodiment, the cavity does not extend as far as the electrical connection 31. Cooling is essentially through the outer wall 48, but also through the material of the current lead 22 to the electrical connection 31. Rather than a simple boiling-recondensing mechanism as described with reference to FIGS. 3-5, the embodiment of FIG. 6 may also, or instead, operate by convection currents in a fluid within cavity 35. This fluid may be a vapour boiled from a liquid placed within the cavity 35, or may be a liquid, such as an oil, which does not boil at the temperatures of interest. Alternatively, a fluid such as helium may be used, which remains gaseous at all temperatures of interest. However, boiling liquids are preferred as the latent heat involved increases the effectiveness of the thermo-siphon cooling, and the fluid condenses or freezes during steady-state operation and so does not significantly increase thermal load along the current lead.

While the present invention has been described with particular reference to water as the fluid 38 within the thermo-siphon, other fluids may be used which have a boiling point which lies between the expected temperatures of the upper and lower parts of the thermo-siphon. With embodiments such as that shown in FIG. 6, the relevant temperatures are those of the outer wall 48 and the enclosed parts of the positive current lead 22. Water is an obvious candidate as it is non-polluting, has a useful latent heat of condensation, raises no particular safety issues and is very inexpensive. It also has a boiling point (373K) positioned between the expected room temperature (300K) and the expected maximum temperature of the positive current lead (>600K). Water may pose a problem, however, due to its expansion on freezing. Possible alternative liquids and their boiling points at atmospheric pressure include ammonia ($NH_3$) 237.5K; methanol ($CH_3OH$) 338K; ethanol ($C_2H_5OH$) 351K.

A liquid of relatively low boiling point, such as ammonia, may be used with a thermo-siphon according to the present invention, particularly embodiments such as shown in FIG. 6, extending along a lower part of the positive current lead, where temperatures are typically lower.

The embodiments of the invention described above all relate to cooling along the length of a vertical tube, the positive current lead 22. The present invention may be applied to other arrangements, such as cooling of articles which are not tubular, and/or are not vertical. Arrangements such as shown in FIGS. 3 and 6 will operate at any angle, as appropriate convection currents, and possibly also regions of recondensation, will establish themselves. Arrangements such as shown in FIGS. 4-5 may not be suitable for non-vertical arrangement, as thermal contact between the cooling gas flow and the fluid within the cavity 35 is provided only at upper and lower extremities of the cylindrical cavity 35. Adaptations of the embodiments of FIGS. 3 and 4 may be provided for non-vertical arrangements, in which again the thermal contacts between the fluid and the cooling gas are positioned at vertically upper and lower extremities of the cavity, regardless of the cavity's orientation.

The present invention has been described with reference to a gas flow as the cooling medium. One may consider equivalent arrangements in which a liquid flow is used as the cooling medium. In arrangements having liquid cooling flow, however, the resulting cooling effect may be so efficient that arrangements according to the present invention may not be necessary. On the other hand, arrangements such as shown in FIGS. 3-5 may be envisaged in which the electrical connection 31 is liquid-cooled. Such arrangements form part of the present invention. While thermal conduction, such as through an electrical conductor attached to electrical connection 31 will assist with cooling in the described embodiments, the present invention also applies to embodiments in which conduction provides the main, or only, method of cooling the thermo-siphon.

Currently, the auxiliary vent fitting 32 and auxiliary vent tube 30 are of a thermally non-conductive material such as fibreglass-reinforced plastic (GRP). During conventional assembly of a cryostat, the auxiliary vent fitting 32 and auxiliary vent tube 30 is delivered fixed to the turret cover 26, and the auxiliary vent tube 30 is inserted into the positive current lead 22 during assembly. The modifications to the auxiliary vent tube 30 and the positive current lead 22 proposed by the present invention may make this sequence of assembly inappropriate. It is therefore proposed that assembly of a cryostat including a cooled positive current lead 22 according to the present invention may proceed rather as follows. An assembly of the auxiliary vent tube 30 and the positive current lead 22, including the cooling thermo-siphon arrangement 35, 38 of the present invention could be delivered as a complete, pre-assembled and leak-tested assembly, which is later assembled to the turret cover 26 and auxiliary vent tube fitting 32.

A prototype unit has been built and tested to demonstrate the principle of the present invention. The prototype demonstrated a reduction in peak positive current lead temperature of about 100K. In the experiment-a thermo-siphon was constructed in the manner shown in FIG. 3, containing 36 ml of water. In this experiment, no cooling gas was used. Instead, several copper strips were bolted to the electrical connection 31 and their ends immersed in liquid Nitrogen to simulate the cooling effect of helium gas passing over the thermally conductive electrical connection 31 and the electrical conductor connected to it. A locally heated area of the positive current lead settled at a maximum temperature of 373K. In the same equipment, but without water in the cavity, the maximum positive current lead temperature was 493K, over 100K higher for an equal input power. Large temperature gradients were established along the tube. For example, for a 100 W heat input, a temperature difference of 250K was observed along the length of the positive current lead.

The present invention is believed to have particular application in respect to high current systems, as current leads and gas venting arrangements may be used without increasing the problems caused by current lead heating. A higher current through the cooled current lead will cause greater heating, which in turn will cause faster boiling, in turn leading to more effective thermo-siphon cooling. The present invention is also thought to be useful for future cryogenically cooled systems which have reduced cryogen inventory and so have reduced escaping gas available for current lead cooling.

Some current and planned cryogenically cooled magnets do not have cryogen vessels as such. They may have closed-loop cryogen circuits, or may be completely 'dry', relying on mechanical refrigerators and thermal conduction. The thermo-siphon of the present invention is particularly applicable to such magnets. As no cooling gas flow is available, but the thermo-siphon of the present invention may be used to even temperature over the current lead, allowing the heat generated by current ramping to be effectively led to a room temperature heat station, for example through electrical connection 31 and its associated conductor. An embodiment of the present invention, having a thermo-siphon extending substantially the length of the current lead and containing a liquid of low boiling point, such as ammonia, may be used to cool the current lead over substantially its whole length. Current leads for 'dry' magnets may be solid rods rather than hollow tubes.

In conventional cryostats housing superconducting magnets, the turret 19 contributes about 45% of total heat influx during steady-state operation. The present invention enables higher currents to be supplied to the magnet without increasing steady-state heat influx. The use of higher magnet currents enables magnets to be built more cheaply for the same magnetic field strength, as the use of higher currents in the superconducting coils means that fewer turns, and so less wire, may be used for any particular field strength. For example, use of the cooled positive current lead of the present invention enables increased magnet current to be applied, for example in excess of 700 A.

During an imaging procedure, operation of gradient coils generates an oscillating magnetic field, which in turn causes oscillating eddy currents within the material of the OVC 14, the thermal radiation shield 16 and the cryogen vessel 12. These vessels are of resistive material and the eddy currents cause heating to the cryogen within the cryogen vessel. This heating causes increased pressure within the cryogen vessel, and may approach the pressure at which a safety valve will open and wastefully vent cryogen to atmosphere or to a recuperation facility. The present invention reduces the static heat load into the cryogen vessel, reducing the steady state pressure within the cryogen vessel and ensuring a greater range of pressure available to cope with heating due to gradient coil induced heating.

The thermo-siphon arrangement of the present invention only operates during current ramping when heat is generated by current passing through resistive material of the positive current lead 22. Once ramping is complete, the positive current lead is no longer heated and the fluid within the cavity will freeze, or will stratify. In any case, a stable temperature gradient will be established. The thermo-siphon will introduce negligible additional heat load during normal operation.

Most embodiments of the invention do not occupy any space within the cooling gas flow path. Even embodiments according to FIG. 6 may be arranged to occupy very little of the cooling gas flow path, and to be streamlined. The addition of a thermo-siphon according to the present invention accordingly should not impede the egress of cryogen in the event of a quench in a cooled superconducting magnet, and so should not cause an increase in pressure within the cryogen vessel during a magnet quench.

While the present invention has been explained in terms of a positive current lead being heated, while an earthed negative current lead is relatively immune to over heating, the present invention applies equally to the alternative electrical connection, where the positive connection is earthed through the body of the cryostat and the thermo-siphon arrangement of the present invention is applied to cool the negative current lead.

Some known cryogenically cooled magnets are arranged such that, in case of a fault, current is ramped down by electrically connecting the positive and negative current leads. Such ramp-down may take several days to complete. The thermo-siphon cooling of the present invention limits the temperature rise of the current lead, even in the absence of cooling gas flow, as the electrical connector 31 is thermally linked to room temperature by its electrical conductor.

As heat is generated by the electrical current flow through the current leads, the pressure within the cryogen vessel will increase, eventually reaching a pressure at which a quench valve or other safety valve or burst disc will open, providing a cooling gas flow as described above to cool the thermo-siphon and the current leads.

The invention claimed is:

1. A cooled current lead for conducting electrical current into a cooled vessel, the current lead comprising:
   a tubular electrical conductor comprising a region which, in use, is heated by electrical current flowing through it;
   a cooled component situated above the region and which is provided with a path for removal of heat;
   a thermally insulating tube, coaxial with, and at least partially located within, the tubular electrical conductor; and
   a thermo-siphon comprising a cavity in thermal contact with both the region of the electrical conductor and the cooled component, said cavity containing a fluid,
   wherein the cavity is a closed volume defined by a surface of the tube sealed against part of a length of an inner surface of the tubular electrical conductor, such that a surface of the cooled component is exposed within the cavity.

2. A cooled current lead according to claim 1 wherein, in use, the fluid is liquid at the temperature of the cooled component, and is vapour at the temperature of the region.

3. A cooled current lead according to claim 1 wherein the cavity contains a fluid which is liquid at room temperature and atmospheric pressure, and additionally contains a gas at atmospheric pressure.

4. A cooled current lead for conducting electrical current into a cooled vessel, the current lead comprising:
   an electrical conductor comprising a region which, in use, is heated by electrical current flowing through it;
   a cooled component situated above a the region and which is provided with a path for removal of heat;
   a thermally insulating tube, coaxial with, and at least partially located within, the tubular electrical conductor; and
   a thermo-siphon comprising a cavity in thermal contact with both the region of the electrical conductor and the cooled component, said cavity containing a fluid,
   wherein the cavity is provided by a double-walled portion of the tube, extending part of a length of the electrical conductor, the cavity defined by a closed volume between inner and outer walls of the double-walled portion.

5. A cooled current lead according to claim 4 wherein thermally conducting rings are provided at upper and lower ends of the outer wall, respective rings providing thermal contact between the cavity and the region of the electrical conductor and the cooled component.

6. A cooled current lead according to claim 4 wherein holes or gaps are provided through the outer wall, said holes or gaps allowing direct contact between the fluid in the cavity and the region of the electrical conductor and the cooled component.

7. A cooled current lead for conducting electrical current into a cooled vessel, the current lead comprising:
   a tubular electrical conductor comprising a region which, in use, is heated by electrical current flowing through it;
   a cooled component situated above a the region and which is provided with a path for removal of heat; and
   a thermo-siphon comprising a cavity in thermal contact with the region of the electrical conductor, said cavity containing a fluid,
   wherein the cavity is provided by a thermally conductive outer wall sealed against a part of a length of a surface of the electrical conductor below the cooled component, thereby defining the cavity between an outer surface of the electrical conductor and an inner surface of the outer wall, whereby the fluid within the cavity serves to even the temperature over that surface of the electrical conductor which is exposed to the cavity, and
   wherein the thermally conductive outer wall is brazed, welded, or soldered to the tubular electrical conductor.

8. A cooled current lead according to claim 7 wherein said outer wall is cooled by flow of a coolant fluid over its outer surface.

9. A cooled current lead for conducting electrical current into a cooled vessel, the current lead comprising:
   a tubular electrical conductor comprising a region which, in use, is heated by electrical current flowing through it;
   a cooled component situated above a the region and which is provided with a path for removal of heat; and
   a thermo-siphon comprising a cavity in thermal contact with both the region of the electrical conductor and the cooled component, said cavity containing a fluid,
   wherein:
   the cavity is provided by a thermally conductive inner wall sealed against a part of a length of a surface of the electrical conductor below the cooled component, thereby defining the cavity between an inner surface of the electrical conductor and an outer surface of the inner wall, whereby the fluid within the cavity serves to even the temperature over that surface of the electrical conductor which is exposed to the cavity.

10. A cooled current lead according to claim 9 wherein said inner wall is cooled by flow of a coolant fluid over its inner surface.

11. A cryogenically cooled magnet electrically connected to a cooled current lead for conducting electrical current into a cooled vessel, the current lead comprising:
   a tubular electrical conductor comprising a region which, in use, is heated by electrical current flowing through it;
   a cooled component situated above the region and which is provided with a path for removal of heat;
   a thermally insulating tube, coaxial with, and at least partially located within, the tubular electrical conductor; and
   a thermo-siphon comprising a cavity in thermal contact with both the region of the electrical conductor and the cooled component, said cavity containing a fluid,
   wherein the cavity is a closed volume defined by a surface of the tube sealed against part of a length of an inner surface of the tubular electrical conductor, such that a surface of the cooled component is exposed within the cavity.

\* \* \* \* \*